United States Patent [19]

Burkley et al.

[11] 4,037,318

[45] July 26, 1977

[54] METHOD OF MAKING FUSES

[75] Inventors: Harold W. Burkley, Indianapolis; Wayne H. Geno, Noblesville, both of Ind.

[73] Assignee: The United States of America as represented by the Secretary of the Navy, Washington, D.C.

[21] Appl. No.: 735,303

[22] Filed: Oct. 26, 1976

[51] Int. Cl.² .......................................... H01H 69/02
[52] U.S. Cl. ...................................... 29/623; 29/628; 156/73.1; 156/632; 337/285; 337/293
[58] Field of Search .................... 29/623, 626, 628; 156/632, 73.1; 337/297, 292, 293, 283, 284, 285

[56] References Cited

U.S. PATENT DOCUMENTS

| 3,528,048 | 9/1970 | Kirk | 337/401 |
| 3,548,494 | 12/1970 | Haring | 29/623 X |
| 3,564,354 | 2/1971 | Aoki et al. | 29/623 X |
| 3,783,506 | 1/1974 | Rehfeld | 29/623 |
| 3,898,603 | 8/1975 | Cricchi et al. | 337/297 |

Primary Examiner—Victor A. DiPalma
Attorney, Agent, or Firm—R. S. Sciascia; Paul S. Collignon

[57] ABSTRACT

A method of making fuses for a record unit comprising providing an electrical circuit pattern on an insulated substrate and then attaching a plurality of fine wires to the circuit pattern. A groove is provided beneath the wires which are encapsulated collectively but not individually.

6 Claims, 7 Drawing Figures

METHOD OF MAKING FUSES

BACKGROUND OF THE INVENTION

Various devices are used to evaluate the performance of ground and flight crews in their use of military equipment. Generally, a record of performance is made, such as by the use of cameras or tape recorders, and then playback is performed at a later time in order to evaluate the performance.

The present invention relates to a record unit, and method for making same, which consists of a plurality of fuses. When operations which affect a training weapon are performed, fuses in the record unit are blown thus providing permanent information on the crew's performance, which can be used to provide corrective instructions to crew members and to re-evaluate training programs.

One method of making a plurality of fuses is shown and described in U.S. Pat. No. 3,756,887, which issued Sept. 4, 1973, to Ronald F. Cruthers, and which describes a method of producing microfuses on substrates. A layer of chromium is first deposited onto the substrate and then the chromium is masked and etched to produce a plurality of rectangular areas each having a notch therein. A layer of conductive metal is deposited at each end of each rectangular area to provide a conductive path to each chromium microfuse.

SUMMARY OF THE INVENTION

The present invention relates to a method of making a plurality of fuses on an assembly which, when selectively blown, provide a permanent record of an event. An electrical circuitry pattern is provided on a substrate of insulating material and at least one groove is provided in the substrate in an area not covered by the electrical circuitry pattern. A plurality of fine wires are attached to the electrical circuitry pattern and bridge the groove in the substrate. The ends of the fine wire which are attached to the electrical circuitry pattern are encapsulated, and the portion of the wires between the encapsulated ends is covered with an adhesive-backed tape. A second encapsulation is provided to cover the adhesive-backed tape and the areas previously encapsulated.

It is therefore a general object of the present invention to provide an improved method of producing a plurality of fuses for a record unit.

Other objects, advantages and novel features of the present invention will become apparent from the following detailed description of the invention when considered in conjunction with the accompanying drawing.

DESCRIPTION OF THE PREFERRED EMBODIMENT

Figure 1:
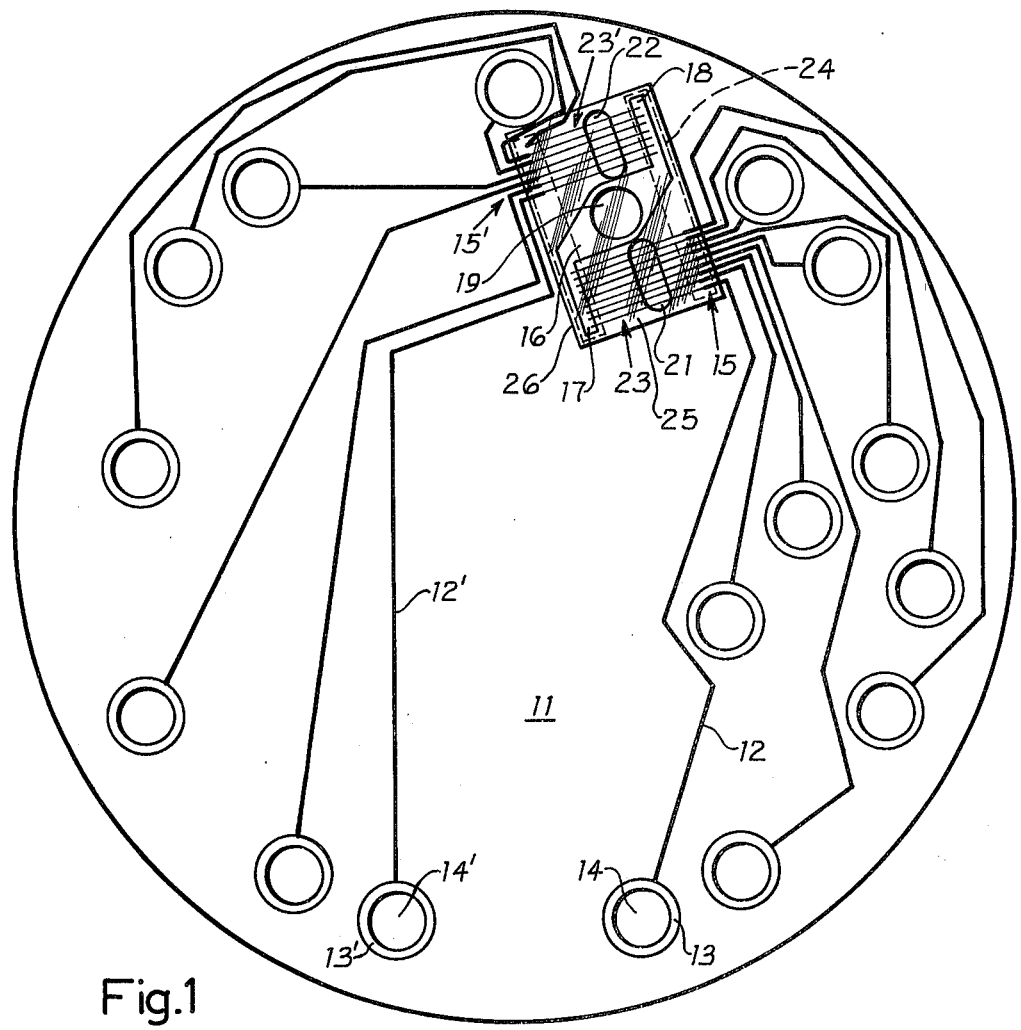
FIG. 1 is a top plan view showing a plurality of fuses on a substrate having electrical conductors thereon.
Figure 2A:
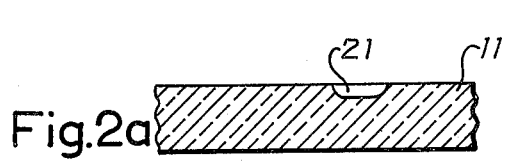
FIGS. 2a through 2f are sectional views depicting fuses in various stages of manufacture.
Figure 2D:
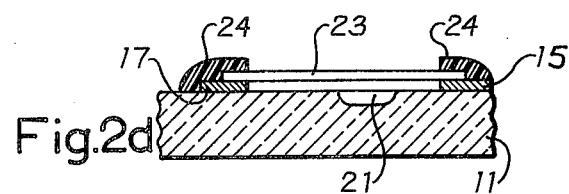
Figure 2B:
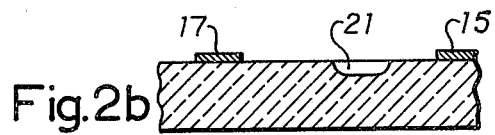
Figure 2E:
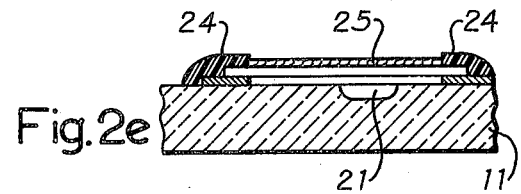
Figure 2C:
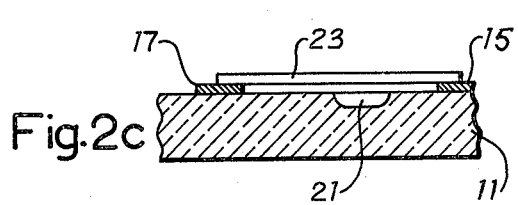
Figure 2F:
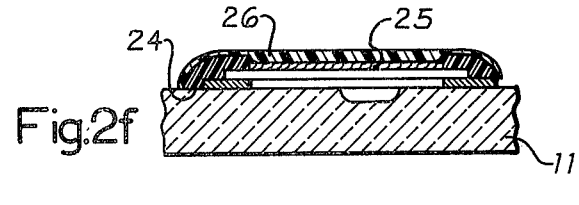

Referring now to the drawing, there is shown in FIG. 1, a substrate 11, which is of insulating material, such as glass or ceramic material. Electrical conductors 12 are provided on substrate 11 and, by way of example, might be etched from a layer of copper foil which is adhesively secured to substrate 11. Each conductor 12 starts at an annular ring 13 and holes 14 are provided so that terminals (not shown) might be attached to the substrate 11. A plurality of parallel fingers 15 are also provided on substrate 11 and each finger is connected to a separate conductor 12. As shown in FIG. 1 of the drawing, two groups of fingers are provided, there being 9 fingers in one group and 7 fingers in a second group. A buss pad 16 is provided on substrate 11 and, by way of example, might be etched from the same layer of copper foil which is used to form conductors 12 and fingers 15. Buss pad 16 has two arms 17 and 18 which extend outwardly in opposite directions. Arm 17 extends in a direction toward one group of fingers 15 and arm 18 extends in a direction toward the second group of fingers 15. A hole 19 is provided through buss pad 16 and substrate 11 so that a terminal (not shown) may be provided.

Grooves 21 and 22 are provided in substrate 11 with groove 21 being positioned between fingers 15 and arm 17 and groove 22 being positioned between fingers 15 and arm 18. Fine wires 23 are connected between each finger and arms 17 and 19 that are provided on buss pad 16. As best shown in FIG. 1 of the drawing, grooves 21 and 22 are of suffficient length so that each wire 23 will pass over one of the grooves. Wires 23 are preferably 0.4 mil platinum wire and are preferably attached to the copper fingers 15 and arms 17 and 18 by ultrasonic bonding. When using 0.4 mil wire, grooves 21 and 22 should have a width of about 1/32 inch and also a depth of about 1/32 inch. Grooves 21 and 22 insure that the fine wires will sever when an overload current is applied and, without a groove, a wire may become red hot and melt and then fuze together so that there is not a break.

An epoxy adhesive material 24 is applied to the ends of wires 23 in order to provide additional strength to the weld joint. By way of example, epoxy adhesive material 24 might be Ablefilm 552, which is manufactured and sold by Ablestik Laboratories, Gardena, Calif. "Ablefilm 552" is a glass supported, tack free, epoxy film adhesive designed for hermetic sealing of microelectronic packages. Epoxy adhesive material 24 is cured by heating at 80° C. for 4 hours. Next a masking material 25 is placed over wires 23 between the cured epoxy adhesive material 24 and then a second coating of epoxy material 26 is applied to cover the fuse assembly. By way of example, epoxy adhesive material 26 might be a two component material consisting of an epoxy base resin and a hardener. Masking material 25 is used to prevent the adhesive material 26 from filling grooves 21 and 22 and also for preventing the adhesive material 26 from individually encapsulating fine wires 23. Masking material 26, by way of example, might be adhesive-backed paper.

A record unit was manufactured and tested at the Naval Avionics Facility, Indianapolis, according to the teachings of the present invention. The fuses had the following design requirements:

DC resistance before firing 10 ohms
No fire current 80 ±5mA for 60 secs.
All fire current 440 ±5 mA
All fire voltge 28 ±1VDC
Max. fire time at all fire current or voltge 0.002 sec
Resistance after firing 10 M ohms min. at 50 ± 5 VDC The fuse wires 23 were made from 0.4 mil platinum wire which were ultrasonically bonded to copper conductors on an epoxy glass printed wiring board. The fuses performed their desired function and met the above-listed electrical requirements.

It can thus be seen that the present invention provides an improved method of making a plurality of fuses which can be used in a record unit to provide a permanent record of an electrical event.

Obviously many modifications and variations of the present invention are possible in the light of the above teachings.

We claim:

1. A method of making fuses for a record unit comprising, first providing on an insulated substrate an electrical circuit pattern with which a plurality of fuses are to be connected, next providing a groove in said substarate in an area where said fuses are to be located, next attaching each end of a plurality of fine wires to said electrical circuit pattern, said fine wires crossing said groove in said substrate, next covering the attached ends of said fine wires with a first coating, next masking the uncovered portion of said fine wires with a flexible material, and then encapsulating said fine wires and said first coating with a second coating whereby said flexible material prevents said second coating from individually encapsulating said fine wires and prevents said second coating from entering said groove.

2. A method of making fuses for a record unit as set forth in claim 1 wherein said electrical circuit pattern is etched from a sheet of electrical conductive material bonded to said substrate and includes a common terminal to which one end of each fine wire is attached.

3. A method of making fuses for a record unit as set forth in claim 1 wherein said fine wire is 0.4 mil platinum wire.

4. A method of making fuses for a record unit as set forth in claim 1 wherein said first coating is epoxy and is cured by heating at an elevated temperature.

5. A method of making fuses for a record unit as set forth in claim 1 wherein said second coating is epoxy and is cured by heating at an elevated temperature.

6. A method of making fuses for a record unit as set forth in claim 1 wherein said flexible material is adhesive-backed paper.

* * * * *